United States Patent
Nakamura et al.

(10) Patent No.: US 8,941,421 B2
(45) Date of Patent: Jan. 27, 2015

(54) SEMICONDUCTOR DEVICE

(71) Applicant: Renesas Electronics Corporation, Kawasaki-shi, Kanagawa (JP)

(72) Inventors: Shigeki Nakamura, Kanagawa (JP); Shintaro Mori, Kanagawa (JP); Yoshinori Tokioka, Kanagawa (JP); Kenji Tokami, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/036,763

(22) Filed: Sep. 25, 2013

(65) Prior Publication Data

US 2014/0084972 A1 Mar. 27, 2014

(30) Foreign Application Priority Data

Sep. 26, 2012 (JP) ................................ 2012-212562

(51) Int. Cl.
*H03L 7/00* (2006.01)
*H03L 5/02* (2006.01)
*H03K 17/22* (2006.01)

(52) U.S. Cl.
CPC ................ *H03L 5/02* (2013.01); *H03K 17/223* (2013.01)
USPC ............................ 327/143; 327/142; 327/198

(58) Field of Classification Search
USPC .......................................... 327/142, 143, 198
See application file for complete search history.

(56) References Cited

U.S. PATENT DOCUMENTS

| | | | | |
|---|---|---|---|---|
| 5,446,404 A * | 8/1995 | Badyal et al. | ................. | 327/143 |
| 6,737,884 B2 * | 5/2004 | Shigemasa et al. | ............. | 326/38 |
| 7,639,052 B2 * | 12/2009 | Xiao et al. | .................... | 327/143 |
| 8,575,978 B2 * | 11/2013 | Komatsu et al. | ............. | 327/143 |
| 2003/0020525 A1 * | 1/2003 | Shigemasa et al. | ........... | 327/143 |
| 2008/0012613 A1 * | 1/2008 | Hotaka | ........................ | 327/143 |
| 2009/0002037 A1 * | 1/2009 | Ryoo | ............................. | 327/143 |
| 2009/0066378 A1 * | 3/2009 | Lee et al. | ...................... | 327/143 |
| 2013/0285717 A1 * | 10/2013 | Xiao et al. | .................... | 327/143 |

FOREIGN PATENT DOCUMENTS

| | | |
|---|---|---|
| JP | 06-150029 A | 5/1994 |
| JP | 2012-034101 A | 2/2012 |

* cited by examiner

*Primary Examiner* — Brandon S Cole
(74) *Attorney, Agent, or Firm* — McDermott Will & Emery LLP (57) ABSTRACT

To provide a semiconductor device provided with a power-on reset circuit that can reliably detect decrease in power-supply voltage. The power-on reset circuit provided on the semiconductor device includes: a first comparison circuit that compares a primary voltage with a reference value; and a second comparison circuit that compares a secondary voltage with the reference value. The power-on reset circuit issues a reset signal based on comparison results of the first and second comparison circuits.

6 Claims, 9 Drawing Sheets

SEMICONDUCTOR DEVICE

CROSS-REFERENCE TO RELATED APPLICATION

The disclosure of Japanese Patent Application No. 2012-212562 filed on Sep. 26, 2012 including the specification, drawings and abstract is incorporated herein by reference in its entirety.

BACKGROUND

The present invention relates to a semiconductor device provided with a power-on reset circuit.

A power-on reset circuit outputs a reset signal that enters an activated state (active) at the time of power-on or at the time of decrease in power supply voltage in order to prevent malfunction of a system. When the reset signal enters an inactivated state (i.e., when reset is released), initialization operation of the system is performed.

As a power-on reset circuit, there is a known comparator that compares a power supply voltage with a reference voltage. For example, Japanese Patent Laid-Open No. 1994-150029 (Patent Document 1) discloses a reset control device that has a comparator for comparing an external power supply voltage supplied to a micro computer with a plurality of reference levels that are mutually different in level.

As other type of power-on reset circuit, there are an enhancement type PMOS (Positive-channel Metal Oxide Semiconductor) transistor, a depletion type NMOS (Negative-channel MOS) transistor, and an inverter that outputs a reset signal (for example, refer to Japanese Patent Laid-Open No. 2012-34101 (Patent Document 2)). The PMOS transistor and the NMOS transistor are connected in series between a power supply node and a ground node. A voltage of a connection node of the PMOS transistor and the NMOS transistor is input to the inverter.

SUMMARY

Generally, in a semiconductor device, such as a micro computer unit, provided is an on-chip regulator that generates, by lowering an external power supply voltage (primary voltage), an appropriate voltage level of an internal power supply voltage (secondary voltage). Furthermore, an external capacity is often attached in order to stabilize the secondary voltage. In this case, since the secondary voltage is maintained by the external capacity even though the primary voltage decreases, a value of the primary voltage and a value of the secondary voltage are different from each other. Therefore, there is a case where decrease in power-supply voltage cannot be reliably detected in a conventional power-on reset circuit.

The other problems and the new feature will become clear from the description of the present specification and the accompanying drawings.

A power-on reset circuit with which a semiconductor device according to one embodiment is provided includes: a first comparison circuit that compares a primary voltage with a reference value; and a second comparison circuit that compares a secondary voltage with the reference value. The power-on reset circuit issues a reset signal based on comparison results of the first and second comparison circuits.

According to the above-described one embodiment, the semiconductor device provided with the power-on reset circuit that can reliably detect decrease in power-supply voltage can be provided.

DETAILED DESCRIPTION

Hereinafter, each embodiment will be explained in detail with reference to drawings. Hereinafter, an MCU (Micro Computer Unit) will be explained as one example of a semiconductor device that incorporates a power-on reset circuit. It is to be noted that in the following explanation, the same symbol is attached to the same or the corresponding portion, and explanation thereof may not be repeated.

First Embodiment

Overall Configuration of Semiconductor Device

Figure 1:
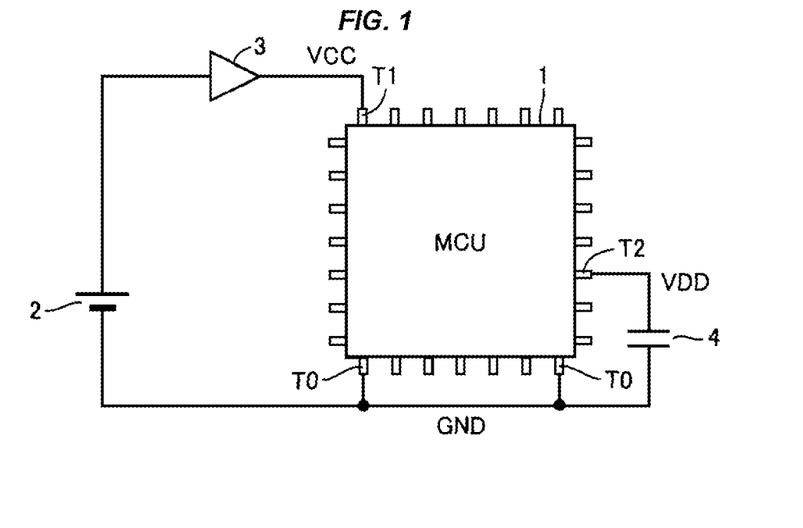
FIG. 1 is a diagram for explaining a usage state of a general MCU.

FIG. 1 is a diagram for explaining a usage state of a general MCU. Referring to FIG. 1, an MCU1 includes: an external power supply terminal T1 that receives an external power supply voltage (primary voltage) VCC; and a ground terminal T0 that receives a ground voltage GND. The ground terminal T0 is connected to a negative electrode of a power supply (a battery or the like) 2. The external power supply terminal T1 is connected to a positive electrode of the power supply 2 through a regulator 3. The regulator 3 is provided for stabilizing the primary voltage VCC.

In the MCU1, further provided is an internal power supply terminal T2 that receives an internal power supply voltage (secondary voltage) VDD from an internal power supply circuit provided inside the MCU1. The internal power supply circuit generates the internal power supply voltage (secondary voltage) VDD that serves as an operation voltage of a logic circuit in a chip based on the primary voltage VCC. An outside external capacity 4 is connected between the internal power supply terminal T2 and the ground terminal T0 in order to stabilize the secondary voltage VDD.

[Configuration of Power-on Reset Circuit]

Figure 2:
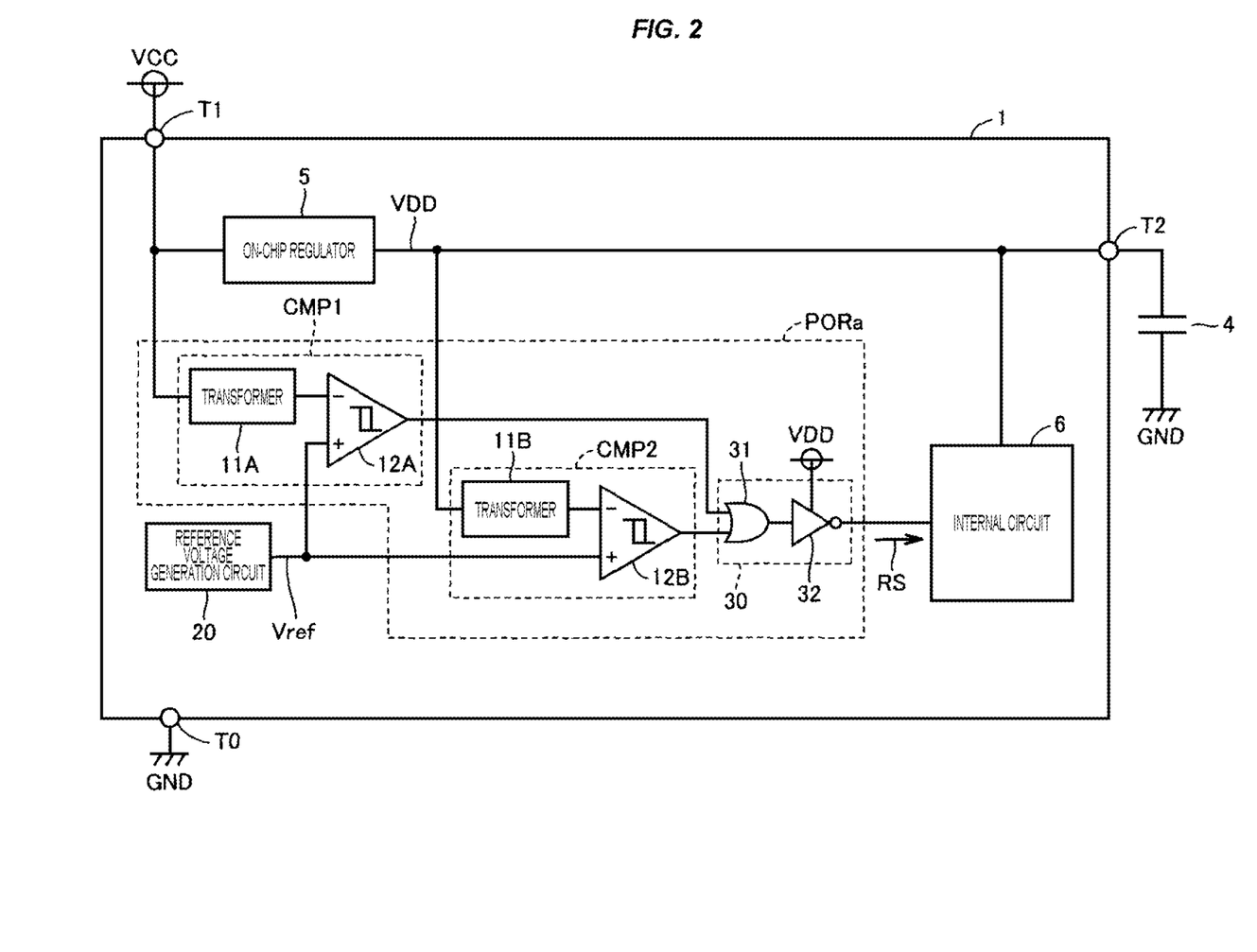
FIG. 2 is a diagram for explaining a power-on reset circuit incorporated in the MCU of FIG. 1.

FIG. 2 is a diagram for explaining a power-on reset circuit incorporated in the MCU of FIG. 1. Referring to FIG. 2, the MCU1 includes: an on-chip regulator (internal power supply circuit) 5; a power-on reset circuit PORa; and a reference voltage generation circuit 20.

The on-chip regulator 5 generates, by lowering the primary voltage VCC, an appropriate voltage level of a secondary voltage VDD as an operation voltage. The secondary voltage VDD is supplied to an internal circuit 6 as the operation voltage.

The power-on reset circuit PORa issues a reset signal RS that enters an activated state (active) at the time of power-on or at the time of decrease in power supply voltage (i.e., when a power supply voltage is not more than a reference value). When the reset signal RS enters the inactivated state (i.e., when reset is released), the internal circuit 6 performs initialization operation. This keeps the internal circuit 6 from operating at a power supply voltage not more than a reference voltage to thereby prevent malfunction of the MCU1.

As shown in FIG. 2, the power-on reset circuit PORa includes: a comparison circuit CMP1 that compares the primary voltage VCC or a voltage proportional thereto with a reference voltage Vref; a comparison circuit CMP2 that compares the secondary voltage VDD or a voltage proportional thereto with the reference voltage Vref; and an output circuit 30. Each of the comparison circuits CMP1 and CMP2 includes: a transformer 11 (11A, 11B); and a comparator 12 (12A, 12B). It is desirable that a hysteresis comparator is used as the comparator 12.

In the comparison circuit CMP1, the transformer 11A, for example, outputs a voltage obtained by dividing the primary voltage VCC with resistance voltage division. If a voltage division ratio is k1 (0<k1≤1), k1×VCC is input to a minus terminal (an inverting input terminal) of the comparator 12A. The reference voltage Vref generated in the reference voltage generation circuit 20 is input to a plus terminal (non-inverting input terminal) of the comparator 12A. When the reference voltage Vref is larger than k1×VCC, the comparator 12A outputs a signal that enters an activated state (a high level (H level) in a case of FIG. 2).

Similarly, in the comparison circuit CMP2, the transformer 11B, for example, outputs a voltage obtained by dividing the secondary voltage VDD with resistance voltage division. If a voltage division ratio is k2 (0<k2≤1), k2×VDD is input to a minus terminal (an inverting input terminal) of the comparator 12B. The reference voltage Vref generated in the reference voltage generation circuit 20 is input to a plus terminal (non-inverting input terminal) of the comparator 12B. When the reference voltage Vref is larger than k2×VDD, the comparator 12B outputs a signal that enters an activated state (a high level (H level) in the case of FIG. 2).

When an output signal of either of the comparison circuits CMP1 and CMP2 is activated, the output circuit 30 outputs the reset signal RS of an activated state (a low level (L level) in a case of FIG. 2).

More specifically, the output circuit 30 includes: an OR gate 31; and an inverter 32. The OR gate 31 performs OR operation of an output signal of the comparison circuit CMP1 and an output signal of the comparison circuit CMP2, and outputs a calculation result. The inverter 32 generates a signal in which a logic level of an output signal of the OR gate 31 has been inverted, and outputs the signal to the internal circuit 6 as the reset signal RS. When the reset signal RS enters an inactivated state (H level) (i.e., when reset is released), the internal circuit 6 performs initialization operation.

Each of the above-described elements of the power-on reset circuit PORa operates by the primary voltage VCC excluding the last-stage inverter 32. The inverter 32 operates by the secondary voltage VDD, and thereby converts a voltage level of the reset signal RS into the VDD level.

[Operation of Power-on Reset Circuit]

Figure 3:
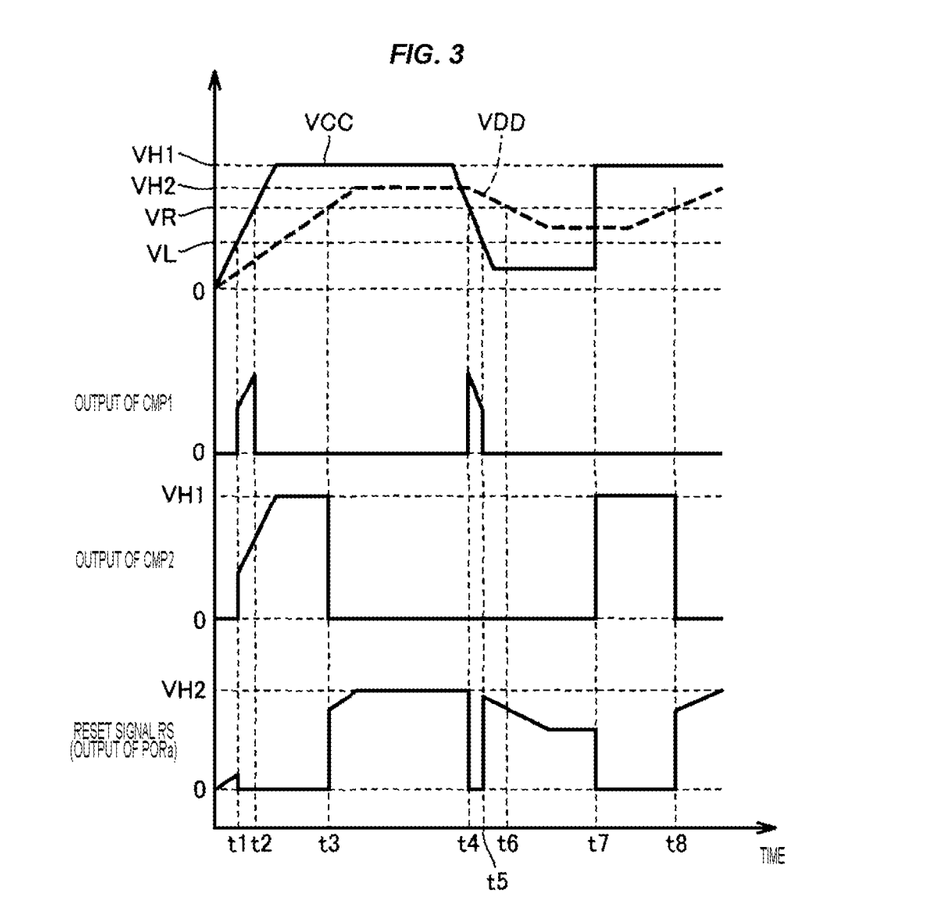
FIG. 3 is a timing chart showing voltage waveforms of each portion of the power-on reset circuit of FIG. 2.

FIG. 3 is a timing chart showing voltage waveforms of each portion of the power-on reset circuit of FIG. 2. FIG. 3 shows a case where after the primary voltage VCC and the secondary voltage VDD stabilized as rated voltages VH1 and VH2, respectively after power-on, they temporarily decreased. Change of the secondary voltage VDD is delayed more than change of the primary voltage VCC by the external capacity 4 shown in FIG. 2.

However, for the purpose of simplification, the waveform chart of FIG. 3 is created on the basis of the following assumption. Namely, assume that the transformers 11A and 11B of FIG. 2 are not used (the voltage division ratios k1 and k2 may be respectively considered to be equal to 1). Assume that the comparators 12A and 12B are not hysteresis comparators, and simply compare the power supply voltages (the primary voltage VCC and the secondary voltage VDD, respectively) with the reference voltage Vref (a constant voltage VR). Assume that when the primary voltage VCC is larger than an operation lower-limit voltage VL, the reference voltage generation circuit 20 outputs the constant voltage VR as the reference voltage Vref. When the primary voltage VCC is not more than the operation lower-limit voltage VL, the reference voltage generation circuit 20 sets the output voltages of the comparators 12A and 12B (i.e., the comparison circuits CMP1 and CMP2) to 0.

As shown in FIG. 3, at the time of power-on, when the primary voltage VCC is lower than the reference voltage VR and higher than the operation lower-limit voltage VL (i.e., for a period from times t1 to t2), the comparison circuit CMP1 outputs an H-level signal. When the secondary voltage VDD is lower than the reference voltage VR, and the primary voltage VCC is higher than the operation lower-limit voltage VL (i.e., for a period from the time t1 to a time t3), the comparison circuit CMP2 outputs an H-level signal. Accordingly, at the time of power-on, the reset signal RS is in the activated state (L level) for the period from the times t1 to t3. Reset is released at the time t3, and thereby the internal circuit 6 performs initialization operation.

As described above, at the time of power-on, both the primary voltage VCC and the secondary voltage VDD are monitored, and thereby a reset signal can be reliably issued.

Next, when the power supply voltage decreases from the rated voltage, in a case where the primary voltage VCC is lower than the reference voltage VR and higher than the operation lower-limit voltage VL (i.e., for a period from times t4 to t5), the comparison circuit CMP1 outputs the H-level signal. In contrast with this, the output signal of the comparison circuit CMP2 does not enter the activated state (H level). This is because, although the secondary voltage VDD becomes lower than the reference voltage VR after a time t6, the primary voltage VCC has already been lower than the operation lower-limit voltage VL.

Meanwhile, when the primary voltage VCC rapidly increases at a time t7, a response of the reference voltage generation circuit 20 is delayed, and thus the output signal of the comparison circuit CMP1 does not enter the activated state (H level). In contrast with this, when an external capacity for stabilizing the secondary voltage is attached, change of the secondary voltage VDD becomes moderate. Accordingly, when the secondary voltage VDD is lower than the reference voltage VR, and the primary voltage VCC is higher than the operation lower-limit voltage VL of the reference voltage generation circuit 20 (i.e., for a period from the time t7 to a time t8), the comparison circuit CMP2 outputs an H-level signal. As a result of this, the reset signal is released at the time t8, and thereby the internal circuit 6 performs initialization operation.

However, when the primary voltage VCC temporarily decreases, in a case where decrease of the secondary voltage VDD is small, and the secondary voltage VDD exceeds the reference voltage VR, the output signal of the comparison circuit CMP2 is not activated, either. Therefore, the reset signal may not be issued. This problem will be dealt with in a Second Embodiment.

[Effect of First Embodiment]

A conventional power-on reset circuit monitors as a target only either of the primary voltage VCC and the secondary voltage VDD, and activates the reset signal (also referred to as "issues the reset signal") by detecting the decrease of the primary voltage or the secondary voltage as a target to be monitored. In this case, since the primary voltage and the secondary voltage are not necessarily the same as each other depending on an operation condition of the MCU, an internal reset signal cannot always be issued at an appropriate timing only by monitoring one power supply voltage. The reason is that a capacity (an external capacity) to be added outside is generally installed in a secondary voltage system of the MCU, accordingly, a difference occurs between a primary voltage and a secondary voltage by charging and discharging of the external capacity.

For example, there is a case where as in a period from the times t2 to t3 of FIG. 3, even though the primary voltage VCC falls in an operable voltage region, the secondary voltage VDD does not meet the operable voltage region. In this case, there is a problem in which when only the primary voltage VCC is monitored as the target, reset is released before the secondary voltage VDD reaches the operable voltage region. There is a problem in which the internal reset signal is not issued also when the secondary voltage rapidly drops to be in a voltage region out of operation assurance by rapid increase in a load current. As described above, when only the primary voltage is monitored, it is difficult to assure stable operation of the circuit in the whole MCU.

Conversely, when only the secondary voltage VDD is monitored as the target, the secondary voltage is determined by operation of an internal circuit of the MCU, and thus it becomes difficult to adjust stability of a power supply, a transient characteristic, and the like with adding an external circuit by a user. Further, it becomes difficult to implement a fail-safe function in which an internal state of the MCU is previously saved in response to the decrease of the primary voltage VCC before the secondary voltage VDD decreases.

In the power-on reset circuit of the First Embodiment, both the primary voltage VCC and the secondary voltage VDD are monitored, and the internal reset signal is issued (activated) when either of the voltages decreases lower than the reference value, and thus initialization operation of the system at the time of the decrease of the power supply can be performed more reliably.

Second Embodiment

Problem of Second Embodiment

When power consumption of the circuit to which the primary voltage VCC is supplied temporarily rapidly increases, the primary voltage VCC temporarily decreases. Particularly, when the primary voltage is supplied from a battery, or the primary voltage is stabilized by a high-capacity capacitor, decrease of the primary voltage VCC often occurs. In this case, the reset signal may not be issued in the power-on reset circuit shown in the First Embodiment.

The power-on reset circuit of the First Embodiment utilizes the comparators that compare the power supply voltages (the primary voltage VCC and the secondary voltage VDD) with the reference voltage. While this type of power-on reset circuit has an advantage to be able to suppress variation in reference voltage, an operation voltage region is limited. Therefore, when the primary voltage VCC rapidly rises from a voltage less than the operation lower-limit voltage (VL of FIG. 3), a detection circuit for primary voltage (the comparison circuit CMP1 of FIG. 2) cannot issue the reset signal.

On the other hand, when the external capacity for stabilizing the secondary voltage is attached, change of the secondary voltage VDD becomes moderate. However, when the secondary voltage VDD does not decrease to the reference voltage due to temporary decrease of the primary voltage VCC, a detection circuit for secondary voltage (the comparison circuit CMP2 of FIG. 2) cannot issue the reset signal, either.

In a power-on reset circuit PORb of the Second Embodiment, in order to solve the above-described problem, added is a comparison circuit CMP3 that can reliably issue a reset signal by a low voltage not more than the reference voltage.

[Configuration of Power-on Reset Circuit]

Figure 4:
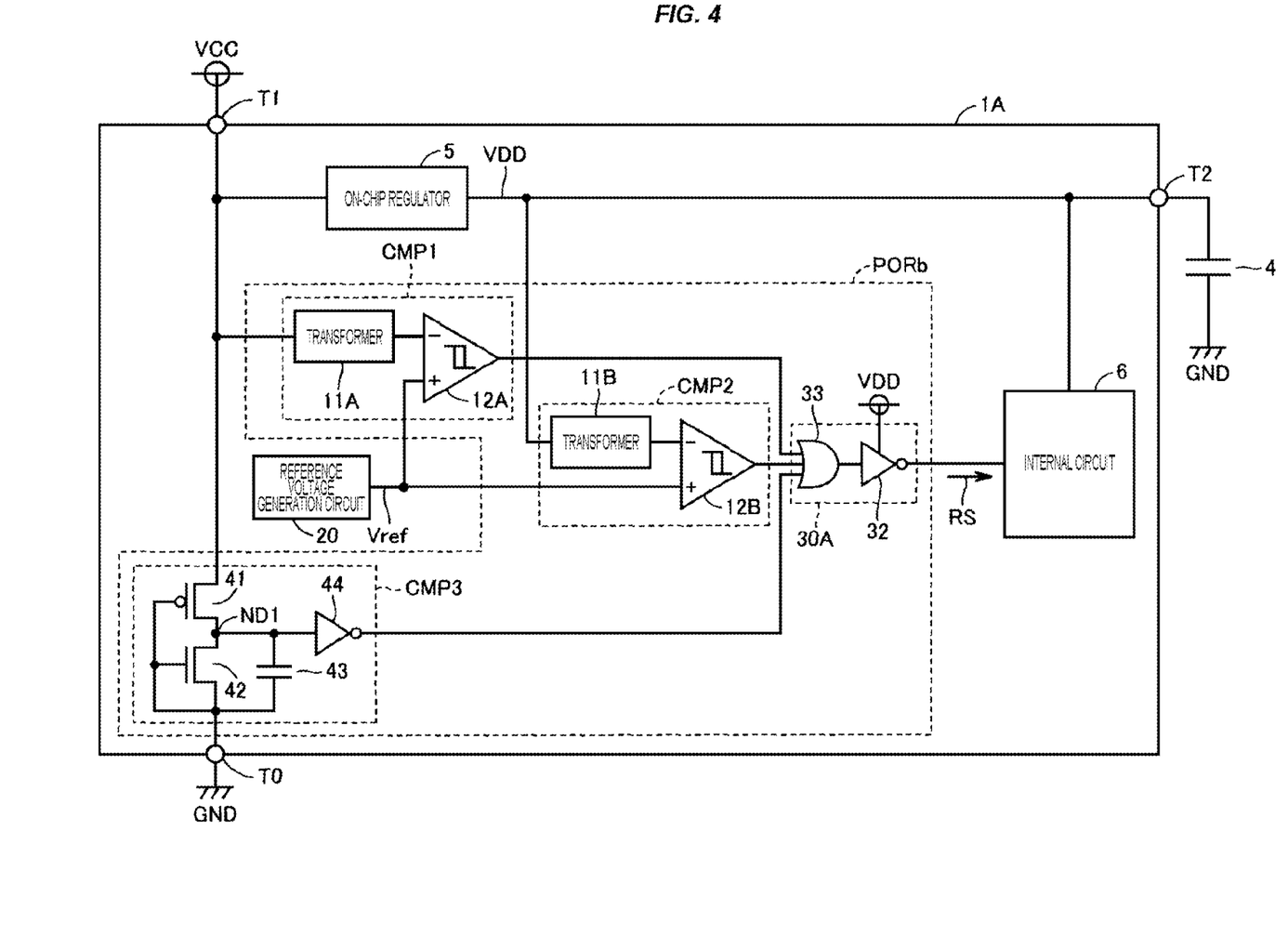
FIG. 4 is a block diagram showing a configuration of a semiconductor device (MCU) according to a Second Embodiment.

FIG. 4 is a block diagram showing a configuration of a semiconductor device (MCU) according to the Second Embodiment. Referring to FIG. 4, the power-on reset circuit PORb provided in an MCU1A is different from the power-on reset circuit PORa of FIG. 2 in a point of further including the comparison circuit CMP3 for low voltage detection. Furthermore, an output circuit 30A of FIG. 4 is different from the output circuit 30 of FIG. 2 in a point of including an OR gate 33 with three inputs instead of the OR gate 31 with two inputs. When any one of the comparison circuits CMP1, CMP2, and CMP3 is in the activated state (H level), the output circuit 30A outputs a reset signal RS of the activated state (L level). Since the other points of FIG. 4 are the same as those of FIG. 2, the same symbol is assigned to the same or the corresponding portion, and explanation thereof is not repeated.

[Configuration and Operation of Comparison Circuit for Low Voltage Detection]

Figure 5:
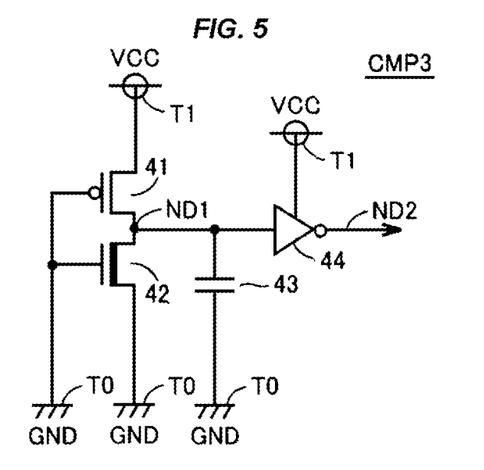
FIG. 5 is a circuit diagram showing an extracted comparison circuit for low voltage detection of FIG. 4.

FIG. 5 is a circuit diagram showing the extracted comparison circuit for low voltage detection of FIG. 4. Referring to FIG. 5, the comparison circuit CMP3 includes: an enhancement type PMOS transistor 41; a depletion type NMOS transistor (also referred to as a "DMOS transistor") 42; a capacitive element 43; and an inverter 44.

The PMOS transistor 41 is connected between the power supply terminal T1 (the primary voltage VCC is applied) and an intermediate node ND1. The DMOS transistor 42 is connected between the intermediate node ND1 and the ground terminal T0 (the ground voltage GND is applied). The capacitive element 43 is connected in parallel with the DMOS transistor 42 between the intermediate node ND1 and the ground terminal T0. The inverter 44 operates by receiving the primary voltage VCC, outputs an H-level signal when a voltage of the intermediate node ND1 is not more than an input threshold voltage VTH, and outputs an L-level signal when the voltage of the intermediate node ND1 exceeds the input threshold voltage VTH.

Figure 6:
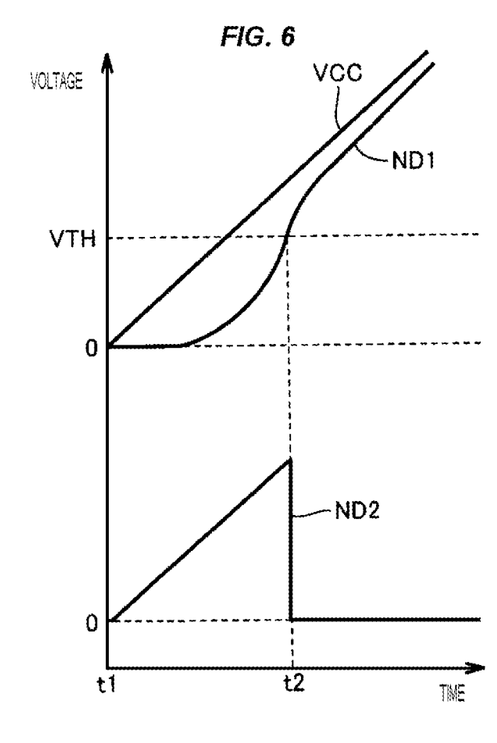
FIG. 6 is a timing chart showing voltage waveforms of each portion of the comparison circuit of FIG. 5.

FIG. 6 is a timing chart showing voltage waveforms of each portion of the comparison circuit of FIG. 5. FIG. 6 shows voltage change of the intermediate node ND1 and voltage change of an output node ND2 of the inverter 44 after the primary voltage VCC is turned on. Hereinafter, operation of the comparison circuit CMP3 will be explained with reference to FIGS. 5 and 6.

The depletion type DMOS transistor 42 can operate even though a power supply voltage is 0 V because it has a minus value of threshold voltage. Accordingly, when the power supply voltage is 0 V at a time t1, the intermediate node ND1 is kept at 0 V, and a voltage of the capacitive element 43 has been initialized to 0 V.

While a voltage between a gate and a source of the PMOS transistor 41 is not more than a threshold voltage of the transistor after power-on, a potential of the intermediate node ND1 is kept at 0 V. After that, when the power supply voltage VCC rises, and a current driving force of the PMOS transistor 41 becomes larger than a current driving force of the DMOS transistor 42, the potential of the intermediate node ND1 rises. When the potential of the intermediate node ND1 exceeds the input threshold voltage VTH of the inverter 44 (at the time t2), an output of the inverter 44 changes to an inactivated state (L level).

Although a current always flows from the PMOS transistor 41 to the DMOS transistor 42 after the time t2, this current path includes only the MOS transistors, and thus a value of the current that flows through the current path is kept substantially constant even though the power supply voltage VCC fluctuates. Since magnitude of the current that flows through the current path mainly depends on a drive force of the DMOS transistor 42, it is effective to increase a transistor channel length L or to narrow a transistor channel width of the DMOS transistor 42 in order to make the current value smaller.

[Operation of Power-on Reset Circuit]

Figure 7:
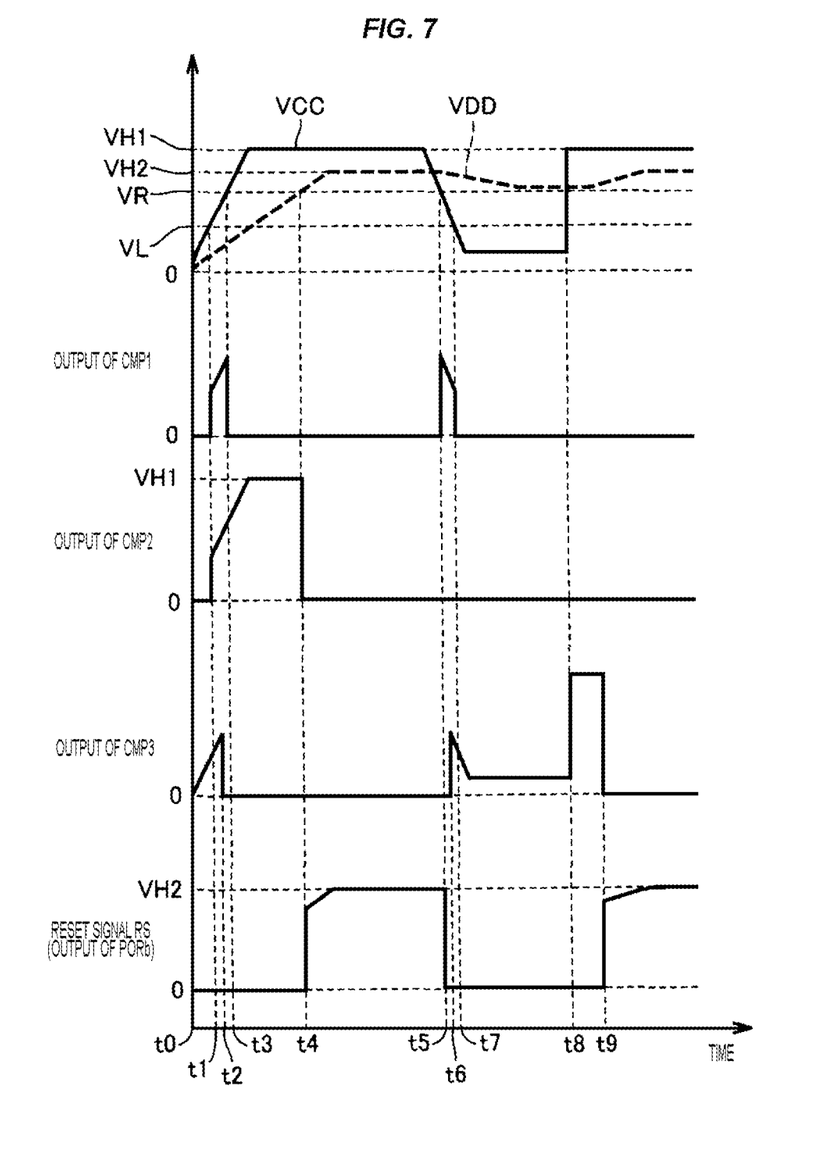
FIG. 7 is a timing chart showing voltage waveforms of each portion of a power-on reset circuit of FIG. 4.

FIG. 7 is a timing chart showing voltage waveforms of each portion of the power-on reset circuit of FIG. 4. FIG. 7, similarly to the case of FIG. 3, shows a case where after the primary voltage VCC and the secondary voltage VDD stabilized as the rated voltages VH1 and VH2, respectively after power-on, they temporarily decreased. Change of the secondary voltage VDD is delayed more than change of the primary voltage VCC by the external capacity 4 shown in FIG. 4. However, unlike the case of FIG. 3, the secondary voltage VDD is kept at a value larger than the reference voltage VR in a time zone when the primary voltage VCC temporarily decreases.

An assumption similar to the case of FIG. 3 is made for the purpose of simplification. Namely, assume that the transformers 11A and 11B of FIG. 4 are not used (the voltage division ratios k1 and k2 may be respectively considered to be equal to 1). Assume that the comparators 12A and 12B are not hysteresis comparators, and simply compare the power supply voltages (the primary voltage VCC and the secondary voltage VDD, respectively) with the reference voltage VR. Assume that when the primary voltage VCC is larger than the operation lower-limit voltage VL, the reference voltage generation circuit 20 outputs the constant voltage VR as the reference voltage Vref. When the primary voltage VCC is not more than the operation lower-limit voltage VL, the reference voltage generation circuit 20 sets the output voltages of the comparators 12A and 12B (i.e., the comparison circuits CMP1 and CMP2) to 0.

As shown in FIG. 7, at the time of power-on, when the primary voltage VCC is lower than the reference voltage VR and higher than the operation lower-limit voltage VL (i.e., for a period from times t1 to t3), the comparison circuit CMP1 outputs an H-level signal. When the secondary voltage VDD is lower than the reference voltage VR, and the primary voltage VCC is higher than the operation lower-limit voltage VL (i.e., for a period from the time t1 to a time t4), the comparison circuit CMP2 outputs an H-level signal. When the voltage of the intermediate node ND1 is lower than the input threshold voltage VTH of the inverter 44 (for a period from a time t0 to the time t2 in FIG. 7), the comparison circuit CMP3 outputs an H-level signal. Accordingly, at the time of power-on, the reset signal RS is in the activated state (L level) for the period from the times t0 to t4, reset is released at the time t4, and thereby the internal circuit 6 performs initialization operation.

Next, when the power supply voltage decreases from the rated voltage, in a case where the primary voltage VCC is lower than the reference voltage VR and higher than the operation lower-limit voltage (i.e., for a period from times t5 to t7), the comparison circuit CMP1 outputs the H-level signal. Since the secondary voltage VDD does not become lower than the reference voltage VR, the output signal of the comparison circuit CMP2 does not enter the activated state (H level). When the voltage of the intermediate node ND1 is not more than the input threshold voltage VTH of the inverter 44 (after a time t6 in FIG. 7), the comparison circuit CMP3 outputs the H-level signal.

On the other hand, when the primary voltage VCC rapidly rises at a time t8, a response of the reference voltage generation circuit 20 is delayed, and thus the output signal of the comparison circuit CMP1 does not enter the activated state (H level). Since the secondary voltage VDD does not become lower than the reference voltage VR, the output signal of the comparison circuit CMP2 does not enter the activated state (H level). In the comparison circuit CMP3, the change of the voltage of the intermediate node ND1 becomes moderate more than the change of the primary voltage VCC as explained in FIG. 6. Therefore, the output signal of the comparison circuit CMP3 is in the inactivated state (L level) after a time t9.

Consequently, when the power supply voltage temporarily decreases in FIG. 7, the reset signal is in the activated state (L level) for a period from the times t5 to t9. Reset is released at the time t9, and thereby the internal circuit 6 performs initialization operation.

[Effect of Second Embodiment]

Figure 8:
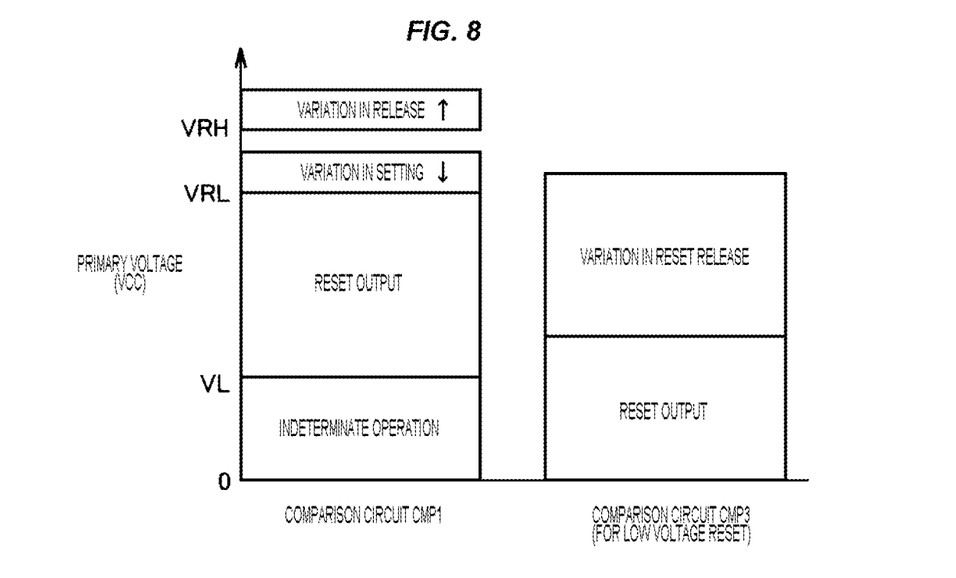
FIG. 8 is a diagram for explaining an effect of the power-on reset circuit of FIG. 4.

FIG. 8 is a diagram for explaining an effect of the power-on reset circuit of FIG. 4. Referring to FIGS. 4 and 8, the power-on reset circuit PORb of the Second Embodiment has two types of circuits, the comparison circuits CMP1 and CMP3, as the circuits for monitoring the primary voltage VCC.

The comparator 12A which constitutes the comparison circuit CMP1 compares the primary voltage VCC or a voltage proportional thereto with a reference voltage generated by the reference voltage generation circuit 20. Since a hysteresis comparator is usually used as the comparator 12A, a reference value VRH when reset is released, and a reference value VRL when reset is set are different from each other. Since the reference voltages are generated by the reference voltage generation circuit 20 including a band gap reference circuit and the like, there is an advantage to be able to make relatively small variation in values of the reference voltages. However, the reference voltage generation circuit 20 does not operate at a voltage not more than the operation lower-limit voltage VL, and thus a point where an operable region of the comparison circuit CMP1 is limited causes a problem. Therefore, when the primary voltage VCC rapidly rises from a voltage (an indefinite operation voltage) less than the operation lower-limit voltage VL, the comparison circuit CMP1 cannot issue the reset signal.

On the other hand, when the voltage of the intermediate node ND1 of FIG. 4 becomes lower than the input threshold voltage of the inverter 44, the comparison circuit CMP3 issues the reset signal (the output signal becomes the H level). Furthermore, the comparison circuit CMP3 can issue the reset signal even when the primary voltage VCC rapidly rises. However, there is a disadvantage that variation in values of the primary voltage VCC when reset is released is comparatively large.

Accordingly, the comparison circuits CMP1 and CMP3 are combined, and thereby the reset signal can be reliably issued independent of an activation start voltage of the primary voltage VCC, and a speed of increase in the primary voltage VCC at the time of activation of the power supply.

[Modification]

Figure 9:
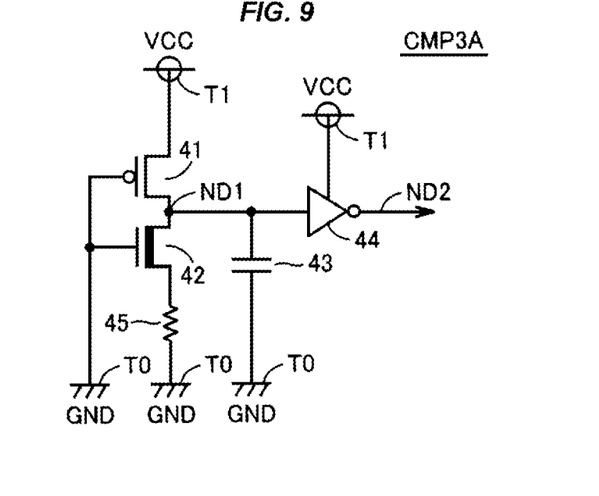
FIG. 9 is a diagram showing a modification of the comparison circuit of FIG. 5.

FIG. 9 is a diagram showing a Modification of the comparison circuit of FIG. 5. Referring to FIG. 9, a comparison circuit CMP3A is different from the comparison circuit CMP3 of FIG. 5 in a point of further including a resistance element 45 connected between the source of the depletion type NMOS transistor 42 and the ground terminal T0. Since the other points of FIG. 9 are the same as those of FIG. 5, the same symbol is assigned to the same or the corresponding portion, and explanation thereof is not repeated.

In the comparison circuit CMP3 of FIG. 5, when the channel length L of the DMOS transistor 42 is lengthened or the channel width W thereof is narrowed in order to make a current value after reset release smaller, a threshold voltage of the DMOS transistor 42 becomes gradually larger. Therefore, it becomes difficult to maintain a characteristic of the depletion type transistor. Consequently, the current value after reset release is made much smaller while maintaining the threshold voltage of the DMOS transistor 42 to be a negative value by providing the resistance element 45.

Furthermore, there is an effect to suppress temperature dependency of a current that flows through the DMOS transistor 42 by providing the resistance element 45. For example, if a drain current of the DMOS transistor 42 increases due to temperature change, increase in the drain current is suppressed because the voltage between the gate and the source of the DMOS transistor 42 decreases.

Third Embodiment

Configuration of Power-on Reset Circuit

Figure 10:
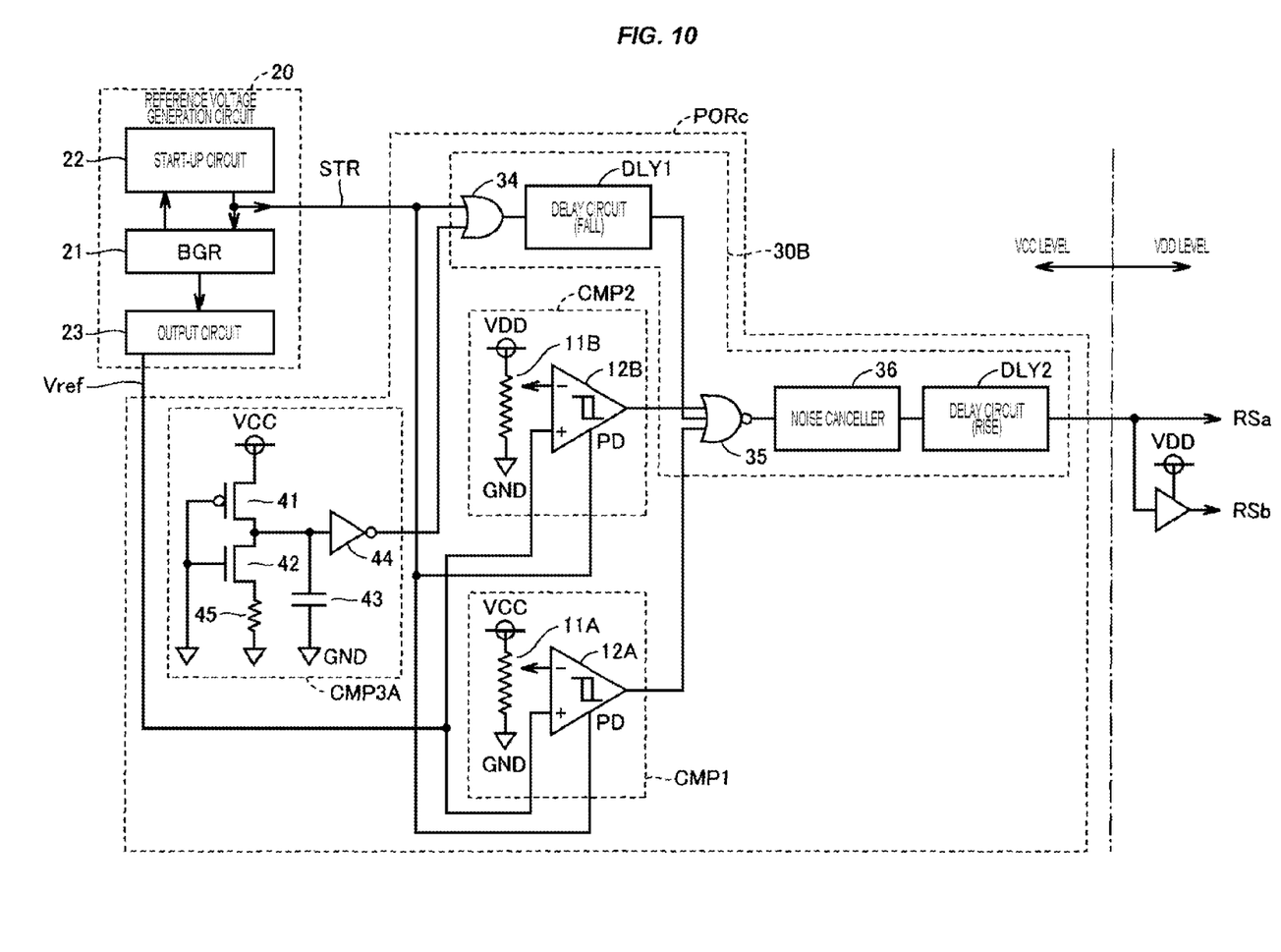
FIG. 10 is a block diagram showing a configuration of a power-on reset circuit in a semiconductor device according to a third embodiment.

FIG. 10 is a block diagram showing a configuration of a power-on reset circuit in a semiconductor device according to a Third Embodiment. Referring to FIG. 10, a power-on reset circuit PORc in the Third Embodiment is the circuit obtained by modifying the power-on reset circuit of the Second Embodiment (FIG. 4) so that a reset signal can be issued more reliably.

Referring to FIG. 10, the power-on reset circuit PORc includes: the comparison circuits CMP1, CMP2, and CMP3A; and an output circuit 30B. Configurations of the comparison circuits CMP1 and CMP2 are basically the same as those explained in FIGS. 2 and 4. However, FIG. 10 shows resistance voltage division circuits instead of the transformers 11A and 11B. A power-down terminal PD is provided at the comparators 12A and 12B. The comparators 12A and 12B start operation when a start-up signal STR that is input to the power-down terminal PD enters an inactivated state (L level). The comparison circuit CMP3A is the same as the one explained in FIG. 9.

The output circuit 30B includes: an OR gate 34; a logic gate 35; delay circuits DLY1 and DLY2; and a noise canceller 36. The OR gate 34 performs OR operation of an output signal of the comparison circuit CMP3A, and the start-up signal STR. In the power-on reset circuit PORc of the Third Embodiment, the start-up signal STR output from the reference voltage generation circuit 20 is also used as a signal that serves as an original to generate a reset signal.

As shown in FIG. 10, the reference voltage generation circuit 20 includes: a BGR (Band Gap Reference) circuit 21; a start-up circuit 22 that generates the start-up signal STR; and an output circuit 23 that generates the reference voltage Vref based on an output voltage of the band gap reference circuit 21. The start-up circuit 22 is the circuit that gives a forced voltage (start-up signal STR) to the band gap reference circuit 21 in order to make the band gap reference circuit 21 immediately stably operate at the time of power-on. The start-up circuit 22 receives a voltage signal from the band gap reference circuit 21, and sets the forced voltage (start-up signal STR) to zero when the band gap reference circuit 21 stably operates and thereby the voltage signal exceeds a threshold value. Accordingly, the start-up signal STR has changed to an inactivated state (L level), and thereby it can be detected that the reference voltage generation circuit 20 is stably operating.

The delay circuit DLY1 delays a timing of a falling edge of an output signal of the OR gate 34. Namely, the delay circuit DLY1 delays the timing when the comparison circuit CMP3A and the start-up signal STR change from the activated state (H level) to the inactivated state (L level). As a result, until the reference voltage Vref generated by the reference voltage generation circuit 20 rises to the steady voltage VR and the comparison circuit CMP1 can reliably detect the power supply voltage VCC, the activated state of the reset signal can be reliably maintained.

The logic gate 35 performs OR operation of each output signal of the comparison circuits CMP1 and CMP2 and an output signal of the delay circuit DLY1, and outputs a signal in which a logic level of a calculation result has been inverted. The logic gate 35 is obtained by coupling the OR gate 33 and the inverter 32 of FIG. 4. An output signal of the logic gate 35 is input to the delay circuit DLY2, after noise thereof is removed by the noise canceller 36.

The delay circuit DLY2 delays a timing of a rising edge of the output signal of the logic gate 35 received through the noise canceller 36. Namely, the delay circuit DLY2 delays the timing when the output signal of the logic gate 35 changes from an activated state (L level) to an inactivated state (H level). As a result, the activated state of the reset signal can be reliably maintained until the secondary voltage VDD rises to a steady voltage level at the time of power-on.

Since the power-on reset circuit PORc having the above-described configuration operates by receiving the primary voltage VCC, a reset signal RSa output from the power-on reset circuit PORc is the VCC-level signal. The reset signal RSa is converted into a VDD-level reset signal RSb by a buffer that operates by the secondary voltage VDD.

[Operation of Power-on Reset Circuit]

Figure 11:
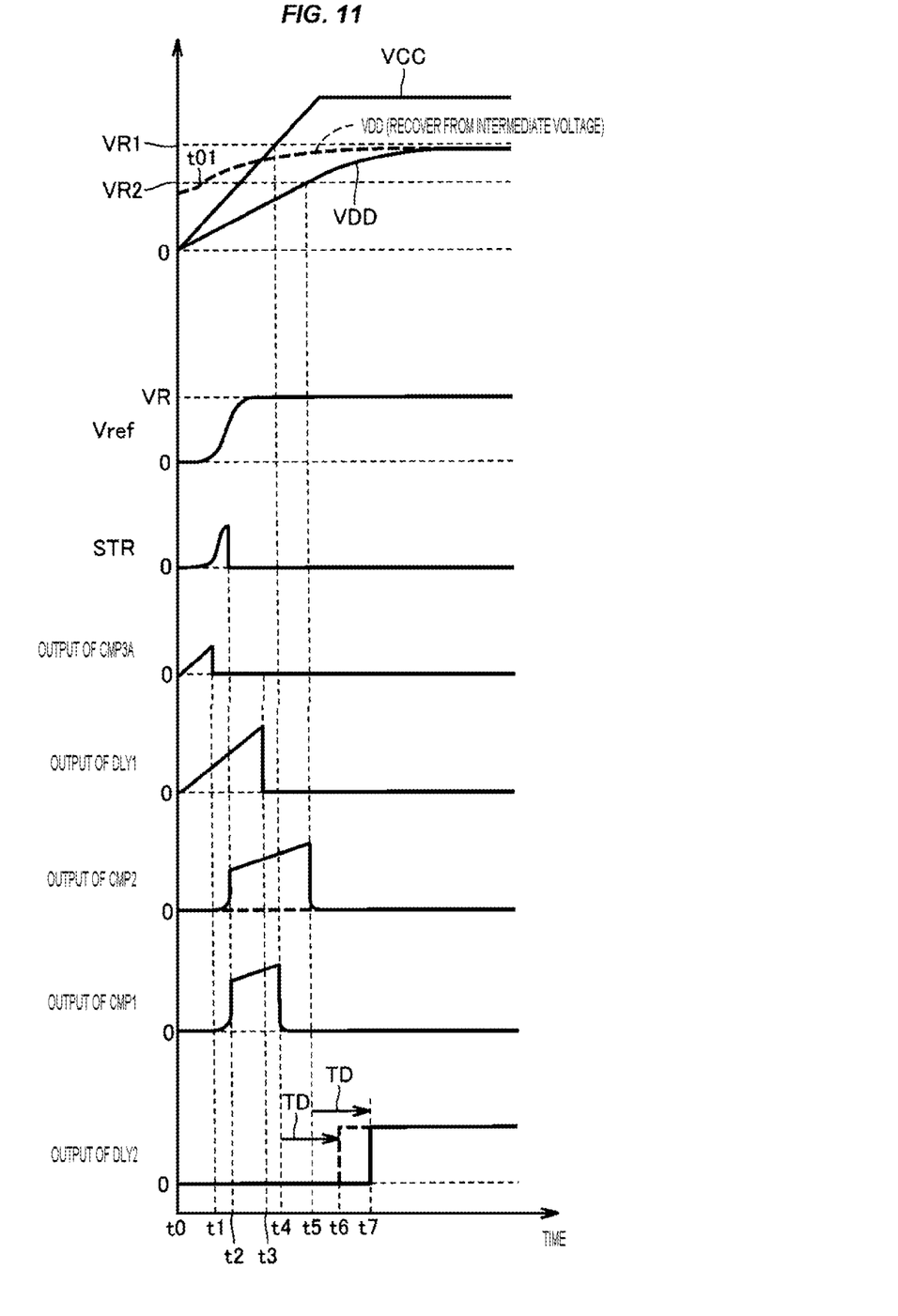
FIG. 11 is a timing chart showing voltage waveforms of each portion of the power-on reset circuit of FIG. 10.

FIG. 11 is a timing chart showing voltage waveforms of each portion of the power-on reset circuit of FIG. 10. FIG. 11 shows, in order from a top, the primary voltage VCC and the secondary voltage VDD, the reference voltage Vref output from the reference voltage generation circuit 20, the start-up signal STR, the output signal of the comparison circuit CMP3A, the output signal of the delay circuit DLY1, the output signals of the comparison circuits CMP2 and CMP1, and the output signal of the delay circuit DLY2.

FIG. 11 further shows waveforms of the secondary voltage VDD: a waveform (solid line) in a case where the secondary voltage VDD increases from zero voltage at the time of power-on; and a waveform (dashed line) in a case where the secondary voltage VDD recovers from an intermediate voltage because the primary voltage VCC temporarily decreased to 0 V.

It is to be noted that for the purpose of simplification, FIG. 11 shows a case where the primary voltage VCC is compared with a reference voltage VR1, and where the secondary voltage VDD is compared with a reference voltage VR2. If the voltage division ratios of the transformers 11A and 11B of FIG. 10 are set as k1 and k2, respectively, and the steady voltage value of the reference voltage Vref is set as VR, in the comparator 12A of FIG. 10, comparing k1×VCC with the reference voltage VR is the same as comparing the primary voltage VCC with the reference voltage VR1 (=VR/k1). Similarly, in the comparator 12B of FIG. 10, comparing k2×VDD with the reference voltage VR is the same as comparing the secondary voltage VDD with the reference voltage VR2 (=VR/k2).

Referring to FIGS. 10 and 11, a case where both the primary voltage VCC and the secondary voltage VDD increase from 0 V at the time of power-on will be explained first. In this case, the output signal of the comparison circuit CMP3A and the start-up signal STR rise substantially simultaneously with power-on.

After that, the output signal of the comparison circuit CMP3A changes to an inactivated state (L level) at a time t1, and the start-up signal STR changes to the inactivated state (L level) at a time t2. The start-up signal STR returns to the inactivated state (L level) at the time t2, and thereby the comparators 12A and 12B which constitute the comparison circuits CMP1 and CMP2, respectively start operation.

The output signal of the delay circuit DLY1 changes to the inactivated state (L level) at a time t3 after elapse of a predetermined delay time from the time t2. Since the reference voltage Vref reliably has the value VR indicating a steady state at the time t3, the comparison circuits CMP1 and CMP2 can be made to stably operate.

After that, since the primary voltage VCC reaches the reference voltage VR1 at a time t4, the output signal of the comparison circuit CMP1 changes to the inactivated state (L level). Since the secondary voltage VDD further reaches the reference voltage VR2 at a subsequent time t5, the output signal of the comparison circuit CMP2 switches to the inactivated state (L level).

The output signal (i.e., the reset signal RSa or RSb) of the delay circuit DLY2 changes to the inactivated state (H level) at a time t7 after elapse of a predetermined delay time TD from the time t5 when the output signal of the comparison circuit CMP2 switched to the inactivated state. Since the secondary voltage VDD (solid line) has almost reached the steady voltage at this time t7, the internal circuit of the MCU can be made to stably operate.

Next, a case where the primary voltage VCC recovers to the steady voltage after temporarily decreasing to 0 V will be explained. In this case, the secondary voltage VDD (dashed line) recovers from the intermediate voltage to the steady voltage. Although the secondary voltage VDD (dashed line) reaches the reference voltage VR2 at a time t01, the start-up signal STR does not return to the inactivated state (L level) at this time. Accordingly, the output signal (dashed line) of the comparison circuit CMP2 remains in the inactivated state (L level). Namely, a reset signal is not issued from the comparison circuit CMP2.

As a result of this, the output signal (dashed line) of the delay circuit DLY2 (i.e., the reset signal RSa or RSb) changes to the inactivated state (H level) at a time t6 after elapse of the predetermined delay time TD after the output signal of the comparison circuit CMP1 changed to the inactivated state (L level). Since the secondary voltage VDD (dashed line) has almost reached the steady voltage at this time t6, the internal circuit of the MCU can be made to stably operate.

[Effect of Third Embodiment]

As described above, in the power-on reset circuit PORc of FIG. 10, the output circuit 30B further receives the start-up signal STR in addition to each of the output signals of the comparison circuits CMP1, CMP2, and CMP3A. Since the reset signal is generated also based on the start-up signal STR, the reset signal can be issued more reliably at the time of a low voltage.

The output circuit 30B basically generates the reset signal RSa or RSb that enters the activated state (L level) when each of the output signals of the comparison circuits CMP1, CMP2, and CMP3A and the start-up signal STR are in the activated state (H level in the case of FIG. 10). Furthermore, in the output circuit 30B of FIG. 10, the delay circuits DLY1 and DLY2 are provided and thereby a period when the reset signal RSa or RSb is in the activated state (L level) is extended. As a result of this, the activated state of the reset signal RSa or RSb can be kept until the secondary voltage VDD reliably rises at the time of power-on.

Hereinbefore, although the invention made by the present inventors has been specifically explained based on the embodiments, the present invention is not limited to the above-described embodiments, and it is needless to say that various changes can be made without departing from the spirit of the invention.

For example, although adding an outside external capacity for the purpose of stabilization of the secondary voltage VDD has been explained as the embodiments, such external capacity may be positively used as an operation voltage supply source for an MCU. For example, in a case where the MCU performs an intermittent operation, although power-on-reset operation is performed according to supply of the primary voltage VCC, as a substantial operation current supply source, charges accumulated in the external capacity may be used as a main operation current source. In such operation, output control of an on-chip regulator may just be performed so that the secondary voltage VDD generated from the primary voltage VCC is supplied according to decrease of the charges accumulated in the external capacity.

What is claimed is:

1. A semiconductor device comprising:
   a power supply circuit that generates an internal power supply voltage based on an external power supply voltage;
   a reference voltage generation circuit that generates a reference voltage based on the external power supply voltage;
   an internal circuit that operates by the internal power supply voltage; and
   a power-on reset circuit that outputs a reset signal to the internal circuit,
   wherein the power-on reset circuit includes:
   a first comparison circuit that generates a first comparison signal;
   a second comparison circuit that generates a second comparison signal; and
   an output circuit that receives the first and second comparison signals as input signals, and generates the reset signal, wherein the first comparison circuit inactivates the first comparison signal when the external power supply voltage or a voltage proportional thereto exceeds the reference voltage, the second comparison circuit inactivates the second comparison signal when the internal power supply voltage or a voltage proportional thereto exceeds the reference voltage, the output circuit activates the reset signal when at least one of the input signals is activated.

2. The semiconductor device according to claim 1, wherein the power-on reset circuit further includes a third comparison circuit that generates a third comparison signal, wherein the output circuit further receives the third comparison signal as an input signal, wherein the third comparison circuit includes:

an enhancement type PMOS transistor that is connected between a node that receives the external power supply voltage and an intermediate node, and receives a ground voltage at a gate;

a depletion type NMOS transistor that is connected between the intermediate node and a ground node to which the ground voltage is given, and receives the ground voltage at a gate; and a first logic gate that generates the third comparison signal of a logic level according to the voltage of the intermediate node, and wherein the first logic gate inactivates the third comparison signal when the voltage of the intermediate node exceeds an input threshold voltage.

3. The semiconductor device according to claim 2, wherein the third comparison circuit further includes a resistance element that is connected in series with the NMOS transistor between the NMOS transistor and the ground node.

4. The semiconductor device according to claim 2, wherein the reference voltage generation circuit includes:

a band gap reference circuit; and a start-up circuit that generates a start-up signal that enters an activated state at the time of power-on and enters an inactivated state after operation of the band gap reference circuit, and outputs the start-up signal to the band gap reference circuit, wherein the output circuit further receives the start-up signal as an input signal.

5. The semiconductor device according to claim 4, wherein the output circuit includes:

a second logic gate that activates a signal to output when at least one of the third comparison signal and the start-up signal is activated;

a first delay circuit that delays a timing when the output signal of the second logic gate switches from an activated state to an inactivated state;

a third logic gate that activates an output signal when at least one of an output signal of the first delay circuit, the first comparison signal, and the second comparison signal is activated; and a second delay circuit that delays a timing when the output signal of the third logic gate switches from an activated state to an inactivated state, wherein the internal circuit receives an output signal of the second delay circuit as the reset signal.

6. The semiconductor device according to claim 1, further comprising:

an internal power supply terminal that receives the internal power supply voltage by being connected to an output node of the power supply circuit, wherein the internal power supply terminal is provided in order to connect an outside capacitor between itself and a ground node.

* * * * *